United States Patent
Chachad et al.

(10) Patent No.: US 8,683,137 B2
(45) Date of Patent: Mar. 25, 2014

(54) CACHE PRE-ALLOCATION OF WAYS FOR PIPELINED ALLOCATE REQUESTS

(75) Inventors: Abhijeet Ashok Chachad, Plano, TX (US); David Matthew Thompson, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 82 days.

(21) Appl. No.: 13/247,222

(22) Filed: Sep. 28, 2011

(65) Prior Publication Data

US 2012/0198171 A1    Aug. 2, 2012

Related U.S. Application Data

(60) Provisional application No. 61/387,283, filed on Sep. 28, 2010.

(51) Int. Cl.
*G06F 12/00* (2006.01)

(52) U.S. Cl.
USPC .......................................................... 711/137

(58) Field of Classification Search
None
See application file for complete search history.

(56) References Cited

U.S. PATENT DOCUMENTS

| 2008/0140941 A1* | 6/2008 | Dasgupta et al. ............. 711/137 |
| 2009/0055587 A1* | 2/2009 | Kellar ........................... 711/118 |

* cited by examiner

*Primary Examiner* — Brian Peugh
(74) *Attorney, Agent, or Firm* — Robert D. Marshall, Jr.; W. James Brady; Frederick J. Telecky, Jr.

(57) ABSTRACT

This invention is a data processing system with a data cache. The cache controller responds to a cache miss requiring allocation by pre-allocating a way in the set to an allocation request according to said least recently used indication of said ways and then update the least recently used indication of remaining ways of the set. This permits read allocate requests to the same set to proceed without introducing processing stalls due to way contention. This also allows multiple outstanding allocate requests to the same set and way combination. The cache also compares the address of a newly received allocation request to stall this allocation request if the address matches an address of any pending allocation request.

4 Claims, 6 Drawing Sheets

CACHE PRE-ALLOCATION OF WAYS FOR PIPELINED ALLOCATE REQUESTS

CLAIM OF PRIORITY

This application claims priority under 35U.S.C. 119(e)(1) to U.S. Provisional Application No. 61/387,283 filed Sep. 28, 2010.

TECHNICAL FIELD OF THE INVENTION

The technical field of this invention is caches for digital data processors.

BACKGROUND OF THE INVENTION

The control logic for a cache manages all aspects of cache accesses including hits, misses, victims, etc. A high performance cache design attempts to minimize the number of stalls that result from the cache control logic. One aspect of cache control logic that can introduce stalls into the pipeline is allocating new lines into the cache.

An N-way set-associative cache consists of M sets, where each set is a collection of N ways. Way is synonymous with cache line and represents a contiguous range of bytes stored in the cache. The data for each way of a cache is uniquely identified by a collection of bits called a tag. When allocating a new cache line into the cache, the control logic first locates a set and way where the cache line will reside. Once a set and way have been identified, the line currently residing there is evicted. If the line is dirty, it is written back to the next level of the memory hierarchy. The data for the new line is requested from the memory hierarchy by a read request also known as an allocate request. An outstanding allocate request is one in which the allocate request has been presented to the memory hierarchy but data has not yet returned to the cache control logic.

The number of outstanding allocate requests that the cache control logic can maintain at any given time is a design decision dependent on several factors: buffer size in the master for recording requests; buffer size in the slave for recording requests; the number of unique transaction IDs allowed at the next level of the memory hierarchy; and the number of ways in each set of the cache The number of ways in each set is a fixed property of the cache design. In a typical cache controller, the number of outstanding allocate requests to the same set is limited to the number of ways in the set. In a four-way set-associative cache, there can be four outstanding allocate requests to any given set. Once the number of outstanding allocate requests to the same set reaches the limit, any further allocate requests will stall the pipeline.

SUMMARY OF THE INVENTION

This invention identifies this as an artificial limitation and removes this limitation by pre-allocating destination ways for read allocate requests. This improves performance by removing unnecessary pipeline stalls.

This invention is a data processing system with a data cache. The data cache has a plurality of cache lines organized in a plurality of sets and plurality of ways. Each way of each set includes a least recently used indication. The cache controller responds to a cache miss requiring allocation by pre-allocating a way in the set to an allocation request according to said least recently used indication of said ways and then update the least recently used indication of remaining ways of the set. This permits read allocate requests to the same set to proceed without introducing processing stalls due to way contention. This also allows multiple outstanding allocate requests to the same set and way combination.

The cache also compares the address of a newly received allocation request to stall this allocation request if the address matches an address of any pending allocation request.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
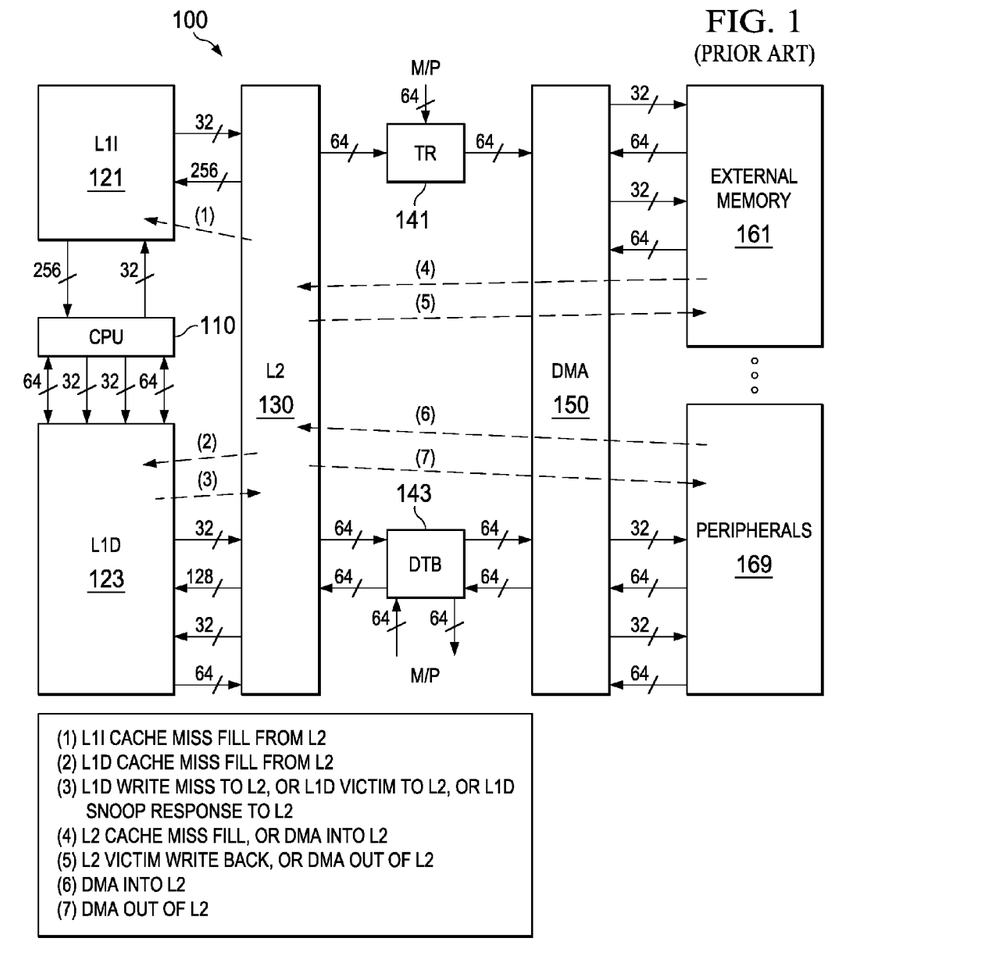
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110.

Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
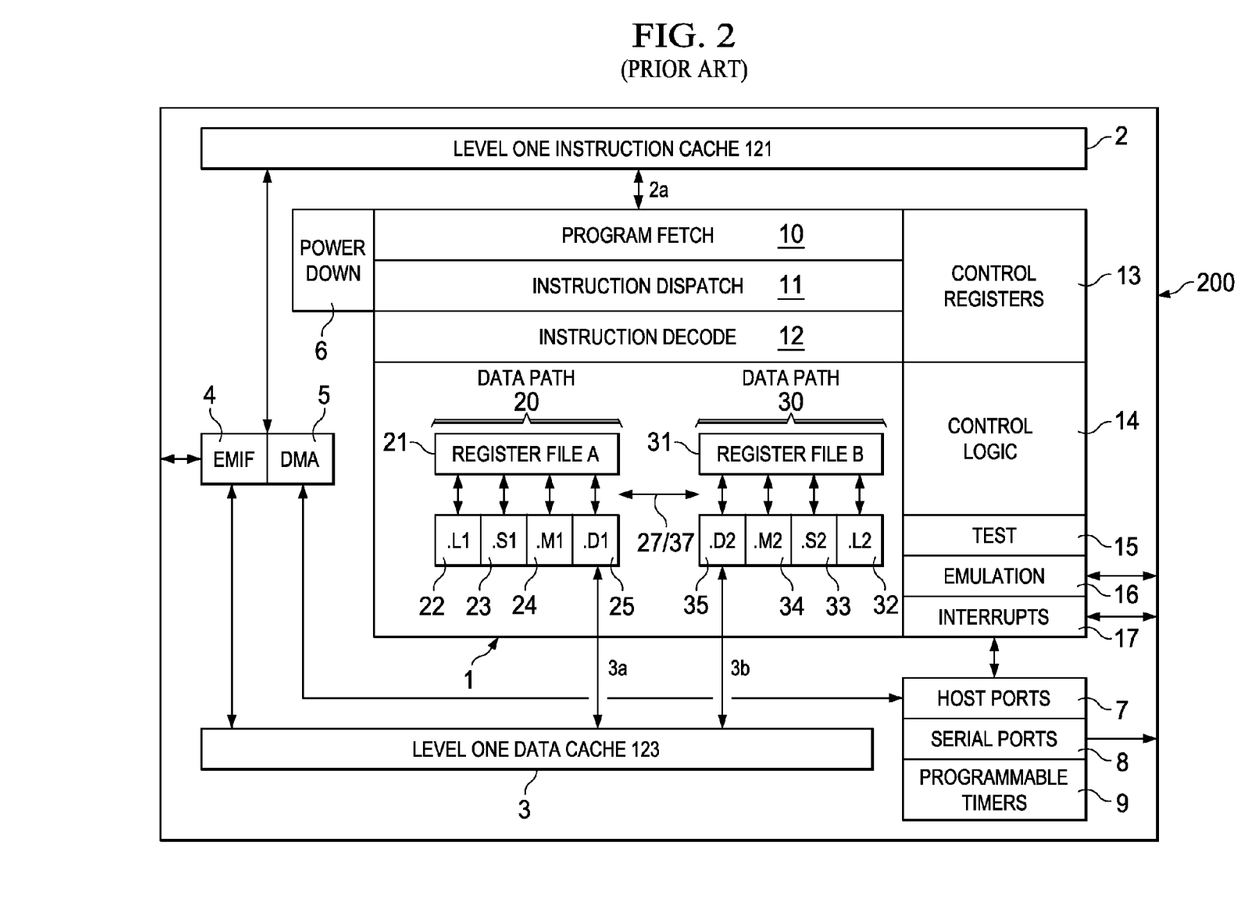
FIG. 2 illustrates details of a very long instruction word digital signal processor core suitable for use in Figure (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
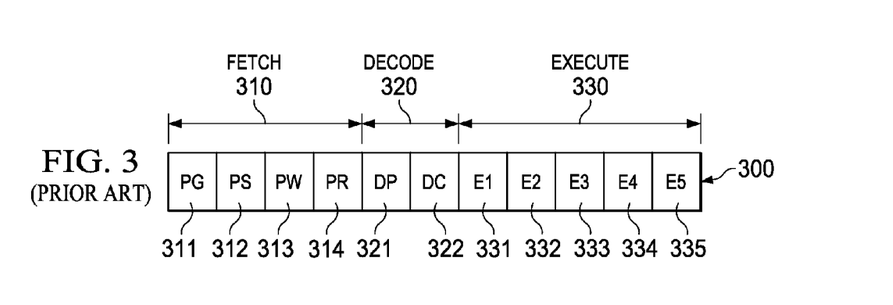
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types.

For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figure 4:
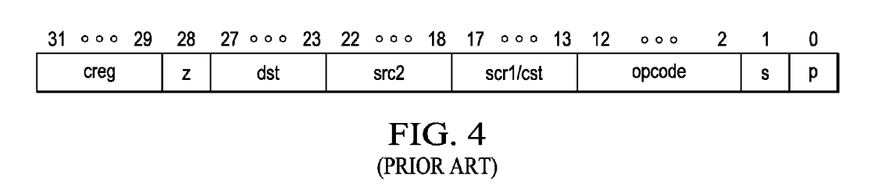
FIG. 4 illustrates the instruction syntax of the very long instruction word digital signal processor core illustrated in FIG. 2 (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

|  | Conditional Register | | | |
| --- | --- | --- | --- | --- |
|  | creg | | | z |
|  | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Figure 5:
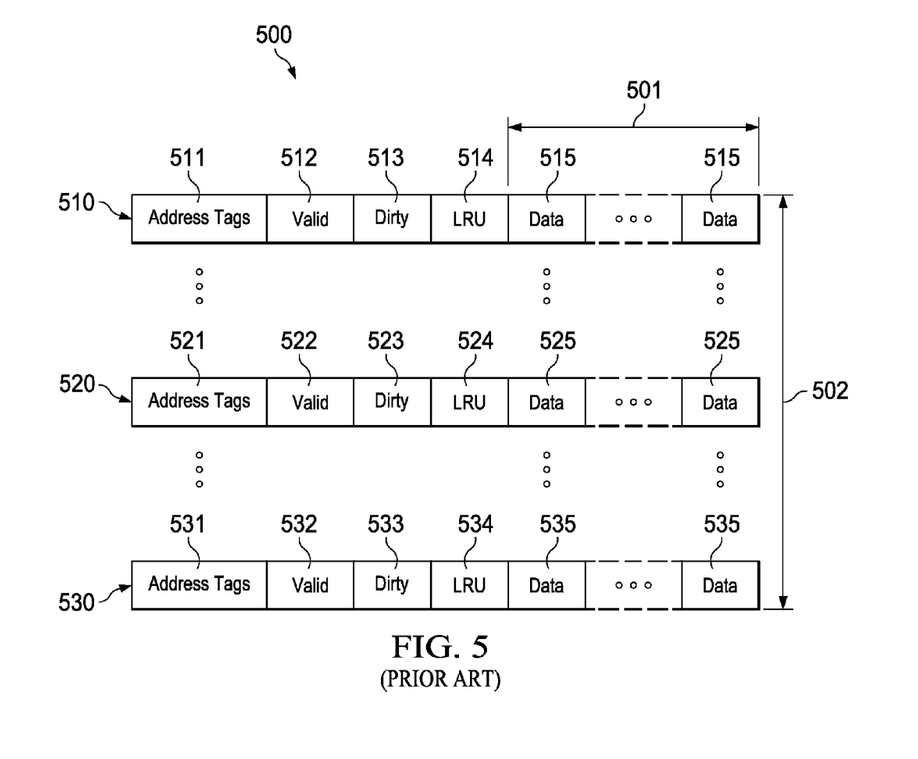
FIG. 5 illustrates a computing system including a local memory arbiter according to an embodiment of the invention.

FIG. 5 illustrates the details of plural cache lines such as used in L1I cache 121, L1D cache 123 and L2 cache 131 illustrated in FIG. 1. Cache 500 illustrated in FIG. 5 includes cache lines 510, 520 and 520 are representative of the internal structure of cache 500. Each of cache lines 510, 520 and 530 includes: respective address tags 511, 521 and 522; respective valid bits 512, 522 and 523; respective dirty bits 513, 523 and 533; respective least recently used (LRU) indicators 514, 524 and 534; and respective data words 515, 525 and 535. Each cache line 510, 520 and 530 includes plural respective data words 515, 525 and 535. The bit length of data words 515, 525 and 535 is set by the minimal addressable data amount of CPU 110. This is typically 8 bits/1 byte.

Cache 500 stores data from more distant memories such as external memory 131 which are accessed by a multi-bit address. Cache 500 is organized to facilitate this storage and to facilitate finding such data in the cache. Each cache line 510, 520 and 530 typically stores $2^N$ respective data words 515, 525 and 535, when N is an integer. The position of data words 515, 525 and 535 within the corresponding cache line 510, 520 and 530 along the dimension 501 serves as a proxy for the least significant bits of the address.

The position of cached data within lines along dimension 502 serves as a proxy for the next most significant bits of the address. The corresponding address tags 511, 521 and 531 form the remainder of the data word address. To determine if a memory access is to data cached within cache 500 (a cache hit), cache 500 compares the address tags for all cache lines to the most significant bits of the memory location accessed. Upon a detecting a match, the position within the cache line along dimension 501 corresponds to the least significant bits of the address permitting identification of the data word accessed.

Each data word 510, 520 and 530 includes a corresponding valid bit 512, 522 and 532. A first state of this valid bit indicates the corresponding data words 515, 525 or 535 are valid. An opposite state of this valid bit indicates the corresponding data words 515, 525 or 535 are not valid. There are several instances where data stored within cache 500 would not be valid. Upon initial activation of digital signal processor system 100 the L1I cache 121, L1D 123 cache and L2 cache 131 would not be loaded. Thus they would not store valid data. Accordingly, all cache lines are initially marked invalid. During a cache access a match of a requested address with address tags 511, 521 or 531 would not detect a match unless the corresponding valid bit 512, 522 or 532 indicated the data was valid.

Each data word 510, 520 and 530 includes a corresponding dirty bit 513, 523 and 533. A first state of this valid bit indicates the corresponding data words 515, 525 or 535 are dirty. An opposite state of this dirty bit indicates the corresponding data words 515, 525 or 535 are not dirty (clean). Cache memory is generally used for both read accessed and write accesses. Upon a cache hit for a write access, the write data is written into the corresponding location within cache 500. According to the preferred writeback technique, this write data is not immediately forwarded to external memory 131. Instead the respective dirty bit 513, 523 or 533 is set to indicate dirty. A dirty indication means that there has been a write to the cached data not currently reflected in the base memory. According to the writeback technique this data is written to the base memory with the expectation that this writeback can accumulate plural writes to the memory location and nearby memory locations within the same cache line to reduce traffic on the bus to external memory 131.

The least recently used (LRU) bits 514, 524 and 534 are used when a cache line is replaced. Because the cache cannot hold all the data stored in the large, slow memory, the data within the cache must be replaced with new data regularly. Using a data words location within dimensions 501 and 502 as proxy for the least significant bits introduces a problem in locating data within cache 500. If there is only a single cache line having the same location on dimensions 501 and 502, then plural data from the large, slow memory will alias to the same cache line in cache 500. This is data having the same least significant address bits corresponding to dimensions 501 and 502 but differing most significant address bits. An access to such aliased data would require the previous data at that cache line to be replaced. This is considered disadvantageous. A typical prior art cache is set associative. Thus a set of cache lines have the same location on dimensions 501 and 502. Typical sets include two members (two-way set associative) or four members (four-way set associative). Each cache line of such a set is called a way. A cache miss to an address that aliases to one of these sets needs only to evict one of these ways. Determination of which way to evict is typically made based on prior usage of these ways. According to both the temporal and spatial locality principles more recently used cache ways are more likely to be reused than less recently used cache ways. LRU bits 514, 524 and 534 track accesses to cache ways within the set. When data is to be replaced the LRU bits indicate the least recently used way for replacement. Maintaining cache coherence requires writeback of a dirty way upon such replacement.

Figure 6:
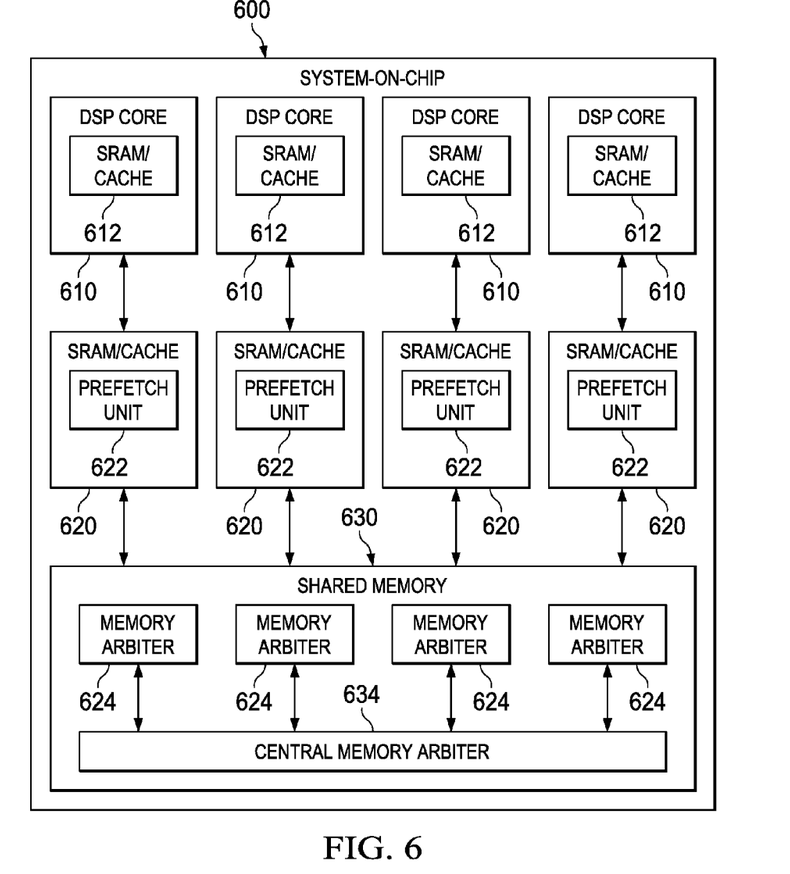
FIG. 6 is a block diagram illustrating a computing system including a local memory arbiter according to an embodiment of the invention.

FIG. 6 is a block diagram illustrating a computing system including a local memory arbiter according to an embodiment of the invention. FIG. 6 illustrates system on a chip (SoC) 600. SoC 600 includes one or more DSP cores 610, SRAM/Caches 620 and shared memory 630. SoC 600 is preferably formed on a common semiconductor substrate. These elements can also be implemented in separate substrates, circuit boards and packages. For example shared memory 630 could be implemented in a separate semiconductor substrate. FIG. 6 illustrates four DSP cores 610, but SoC 600 may include fewer or more DSP cores 610.

Each DSP core 610 preferably includes a level one data cache such as L1 SRAM/cache 612. In the preferred embodiment each L1 SRAM/cache 612 may be configured with selected amounts of memory directly accessible by the corresponding DSP core 610 (SRAM) and data cache. Each DSP core 610 has a corresponding level two combined cache L2 SRAM/cache 620. As with L1 SRAM/cache 612, each L2 SRAM/cache 620 is preferably configurable with selected amounts of directly accessible memory (SRAM) and data cache. Each L2 SRAM/cache 620 includes a prefetch unit 622. Each prefetch unit 622 prefetchs data for the corresponding L2 SRAM/cache 620 based upon anticipating the needs of the corresponding DSP core 610. Each DSP core 610 is further coupled to shared memory 630. Shared memory 630 is usually slower and typically less expensive memory than L2 SRAM/cache 620 or L1 SRAM/cache 610. Shared memory 630 typically stores program and data information shared between the DSP cores 610.

In various embodiments, each DSP core 610 includes a corresponding local memory arbiter 624 for reordering memory commands in accordance with a set of reordering rules. Each local memory arbiter 624 arbitrates and schedules memory requests from differing streams at a local level before sending the memory requests to central memory arbiter 634. A local memory arbiter 624 may arbitrate between more than one DSP core 610. Central memory arbiter 634 controls memory accesses for shared memory 630 that are generated by differing DSP cores 610 that do not share a common local memory arbiter 624.

A cache includes two parts, storage and control logic. The storage part behaves like any RAM structure storing new values when enable pins are asserted. The control logic is where all of the interesting design decisions are reflected. Designing a cache controller requires considering many different aspects of the surrounding pipeline, the access patterns to the cache, and the overall memory system architecture.

A fundamental principle in high performance design is the reduction of stalls. In a pipelined design, work is performed every cycle on transactions in various stages of processing. A stall at any stage of the pipeline reduces performance by preventing transactions behind the stall from advancing to the next stage of the processing pipeline.

This invention pre-allocates destination ways for read allocate requests. This allows the cache control logic to process a continuous stream of read allocate requests to the same set without introducing stalls into the pipeline due to the lack of available destination ways. For each allocate request issued by the cache control logic, the LRU value for the given set is updated immediately before the allocate completes. Once the LRU value is updated the next allocate can be issued. This is because the destination way is known from the updated LRU value.

Our invention facilitates multiple outstanding read allocate requests to the same set/way combination without introducing stalls into the pipeline. During a stream of cache accesses, the cache control logic can service read and write hits to addresses that do not match outstanding allocate requests, and the pipeline will continue to operate without introducing stalls. The first cache access to an outstanding allocate request will result in a pipeline stall.

The key to the novel invention is the proper handling of multiple outstanding allocate requests to the same set/way combination. This is important when a cache access occurs to an address that matches one of the outstanding allocate requests. If not handled properly, the cache control logic will incorrectly report the hit/miss status and potentially corrupt data in the cache.

The following additions are made in the design to facilitate the invention: logic to immediately update LRU value for allocate requests; hit/miss detection to compare incoming accesses with outstanding allocate requests; priority detection logic to determine which outstanding allocate is the newest allocate for a given set/way; and a buffer to record outstanding allocate requests.

In a typical cache controller, the number of outstanding allocate requests to the same set is limited to the number of ways in the set. For example, in a four-way set-associative cache, there can only be four outstanding allocate requests to any given set. Once the number of outstanding allocate requests to the same set reaches the limit, any further allocate requests will stall the pipeline.

This invention identifies this as an artificial limitation and removes this limitation by pre-allocating destination ways for read allocate requests. This improves performance by removing unnecessary pipeline stalls. This invention allows streams of read allocate requests to the same set processed without introducing processing stalls due to way contention. This invention allows multiple outstanding allocate requests to the same set/way combination. This invention includes a hit/miss detection mechanism allowing multiple outstanding allocate requests to the same address provided there is an intervening allocate to a different address but to the same set/way combination.

The following is a brief description of cache behavior as it relates to the invention. When a new line is being allocated into a cache, the destination set is determined by address bits, and the destination way is determined via the replacement policy of the cache. The replacement policy is a set of rules that governs the eviction and replacement of ways in the set to make room for newly allocated lines. The most common replacement policy is Least Recently Used (LRU). According to the LRU policy the way that was accessed least recently will be replaced by the incoming line.

On a read access the cache control logic consults the cache tags to determine if the read access address is present in the cache. If the address is stored in the cache, the access results in a hit and the data is returned from the cache data storage. Otherwise, the access results in a miss. If necessary an allocate request is issued. An allocate request seeks the data from another memory for storage in cache. This allocate request is recorded by the cache controller in a buffer. The cache controller determines the destination way by the replacement policy. If this way is clean, then it is merely replaced by the incoming allocated data. If this way is dirty, it is first written back to base memory. Then the way is clean and can be replaced by the allocated data.

In the prior art if multiple allocates occur to the same set in the cache, the number of available destination ways will reduce with each allocate until there are no available ways. If there are no available ways, the cache control logic will stall until the first outstanding allocate request completes. Then the pending allocate request to the same set may be issued.

Write allocates are nearly identical to read allocates.

When a write access arrives at the cache control logic, a hit will be processed by writing the data into the cache and marking the cache line dirty. A miss will result in an allocate request being issued. The primary difference between a read allocate and a write allocate is that a write allocate will also modify the allocate data when it returns.

Figure 7:
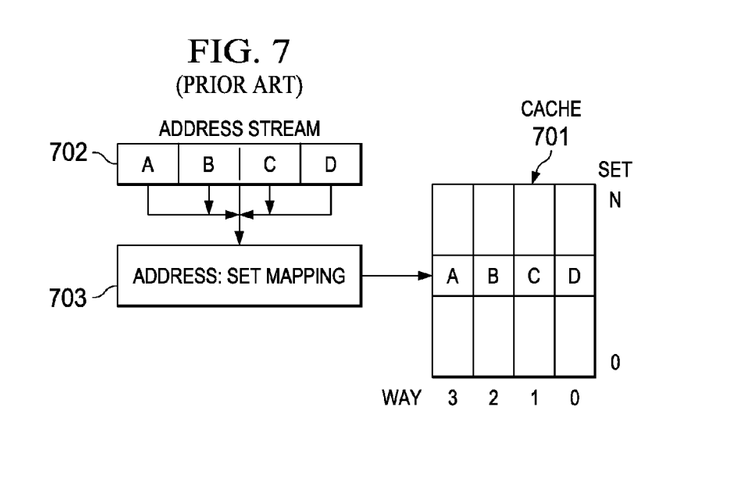
FIG. 7 illustrates a prior art manner of allocating ways.

FIG. 7 illustrates this prior art manner of allocating ways. FIG. 7 illustrates cache way N 701 which includes ways 0, 1, 2 and 3. Buffer 702 stores a sequence of access requests identified by their request addresses. In this example each access request A, B, C and D are cache misses. Also in this example address/set mapping unit 703 determines that each of these requests A, B, C and D map to set 701. In this example address/set mapping unit 703 assigns request A to way 3, request B to way 2, request C to way 1 and request D to way 0. In the prior art address/set mapping unit 703 can assign no more requests to set 701 because all ways are assigned.

This invention pre-allocates destination ways on read allocate requests. This allows the cache control logic to process a continuous stream of read allocate requests to the same set without introducing stalls into the pipeline due to the lack of available destination ways.

Figure 8:
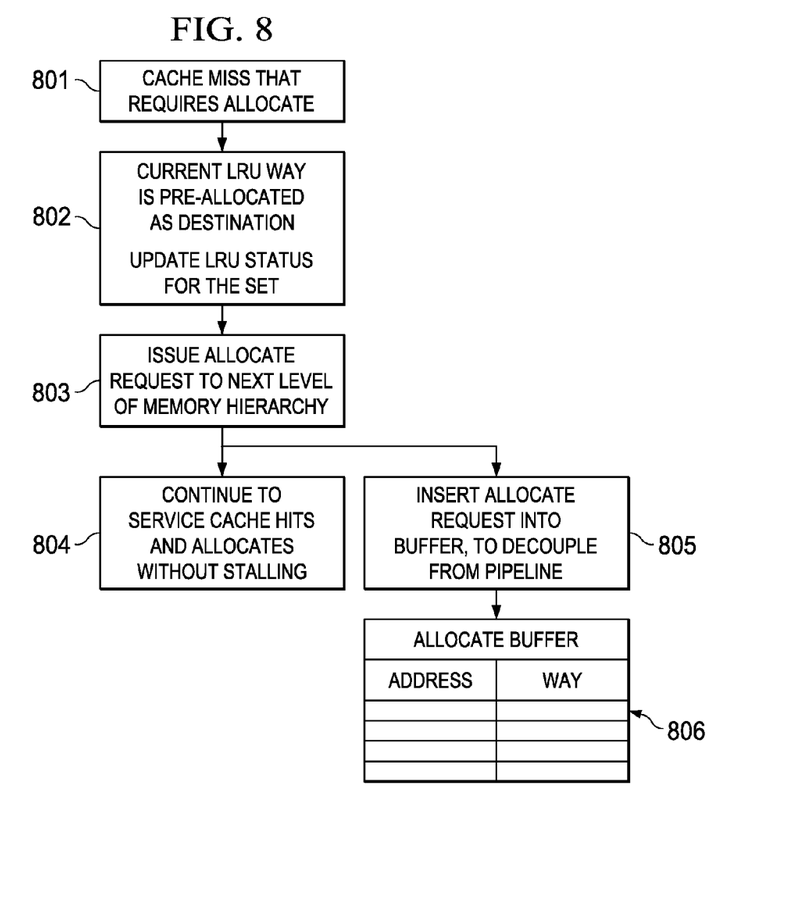
FIG. 8 is a flow chart illustrating the manner of operation of this invention.

FIG. 8 is a flow chart illustrating the manner of operation of this invention. In block 801 the cache controller receives an access request that misses the cache. The process begins with a cache miss that requires an allocate (block 801). For each allocate request issued by the cache control logic, the LRU cache way is pre-allocate and the LRU value for that set is updated immediately (block 802).

This pre-allocation and LRU update occurs before the allocate completes. The cache controller issues the allocate to the next level of the memory hierarchy (block 803).

The process splits into parallel paths executing simultaneously. Once the LRU value update has taken place, the next allocate can be issued because the destination way is known (block 804). The just issued allocate enters a buffer (block 805). This decouples the allocate from the cache controller pipeline. The allocate buffer 806 has plural entries. Each entry includes the address and pre-allocated way of the corresponding allocate.

Figure 9:
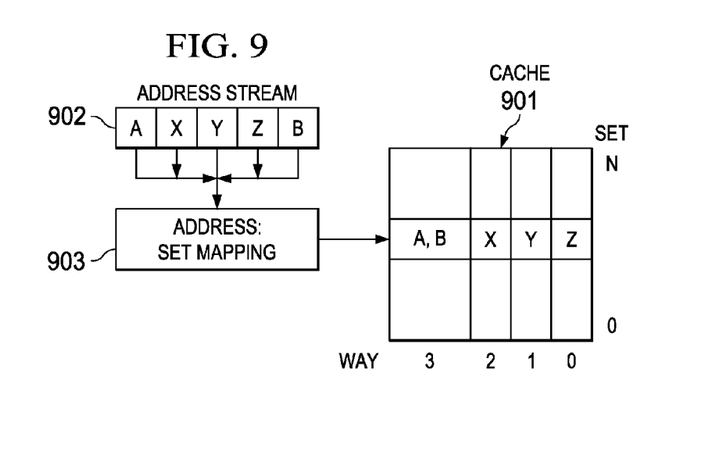
FIG. 9 illustrates the manner of allocating ways according to this invention.

FIG. 9 illustrates the manner of allocating ways according to this invention. FIG. 9 illustrates N way cache 901 which includes ways 0, 1, 2 and 3. Buffer 902 stores a sequence of access requests identified by their request addresses. In this example each access request A, X, Y, Z and B are cache misses. Also in this example address/set mapping unit 903 determines that each of these requests A, X, Y, Z and B map to set 901. In this example address/set mapping unit 903 assigns request A to way 3, request X to way 2, request Y to way 1, request Z to way 0 and request B also to way 3. In according to this invention address/set mapping unit 903 can assign more requests to set 901 than their are ways.

This invention facilitates multiple outstanding read allocate requests to the same set/way combination without introducing stalls into the pipeline. During a stream of cache accesses, the cache control logic can service read and write hits to addresses that do not match outstanding allocate requests. The pipeline will continue to operate without introducing stalls. The first cache access to an outstanding allocate request at the same address will result in a pipeline stall.

The key to the novel invention is the proper handling of multiple outstanding allocate requests to the same set/way combination. This is important when a cache access occurs to an address that matches one of the outstanding allocate requests. If not handled properly, the cache control logic will incorrectly report the hit/miss status and potentially corrupt data in the cache.

Figure 10:
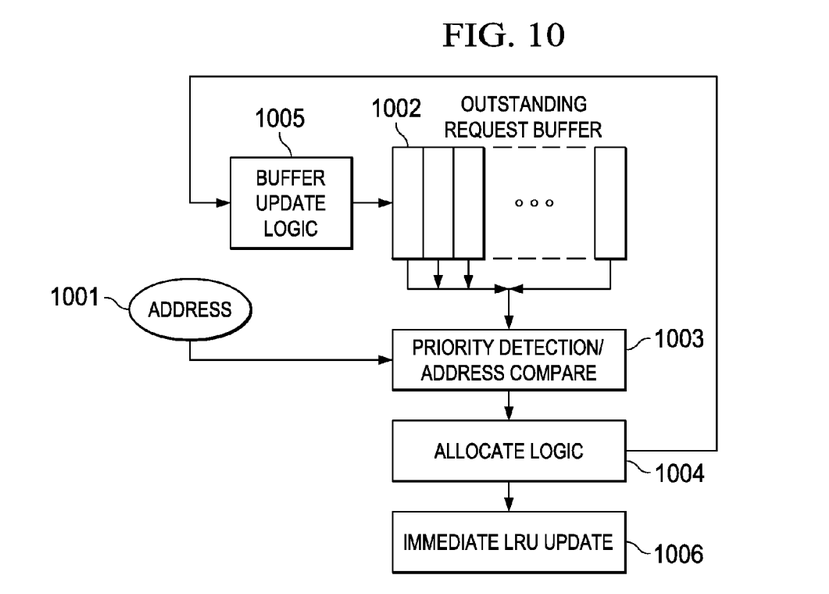
FIG. 10 illustrates hardware to a make determination that allocates addresses do not match outstanding allocate requests.

FIG. 10 illustrates hardware to make this determination. The address of a newly received allocation is stored in buffer 1001. Buffer 1002 corresponds to buffer 902 and stores the addresses of pending allocation requests. Priority detection/access compare 1003 compares the latest allocation request form buffer 1001 with the address of each entry in buffer 1002. There are two possible results. If there is no match between these addresses, then allocate logic 1004 triggers buffer update logic 1005 to add the just received allocation request to outstanding request buffer 1002. At the same time block 1006 immediately updates the LRU status of the corresponding ways of the set hit by the request.

The other result occurs when priority detection/address logic 1003 detects a cache access to an address that is currently in progress as the most recent outstanding allocate request to a given set/way. In this event the pipeline stalls. The distinction between most recent and not most recent is important due to the enabling of multiple outstanding requests to the same set/way. An access to the most recent outstanding allocate request for a given set/way results in a hit to a pending allocate. A hit to a pending allocate results in a pipeline stall. A new allocation access to an outstanding allocate request that is not the most recent request to that set/way results in a miss, which does not result in a pipeline stall.

Priority detection/address compare 1003 always prevents an outstanding allocate request that results from a write access that hits any younger outstanding allocate requests to the same set/way from being issued. Committing that write request could result in the line being modified after the allocation completes. In this case, the line cannot simply be replaced, but it must be sent to the next level of the hierarchy as a victim. For this reason, write allocate requests can create a pipeline stall if the cache control logic attempts to send another allocate request to the same set/way as the write allocate request. A write miss that is not in cache and does not hit a pending allocate, will get pipelined out to outstanding request buffer 1002 via buffer update logic 1005. This access will not stall.

This invention includes the following additions over the prior art: logic to immediately update LRU value for allocate requests; hit/miss detection to compare incoming accesses with outstanding allocate requests; priority detection logic to determine which outstanding allocate is the newest allocate for a given set/way; and a buffer to store outstanding allocate requests.

What is claimed is:

1. A data processing system comprising:
    a central processing unit executing program instructions to manipulate data;
    a data cache connected to said central processing unit temporarily storing in a plurality of cache lines data for manipulation by said central processing unit, said data cache including a plurality of sets each having a plurality of ways and a least recently used indication for each way of each set;
    a cache controller including an address to set mapping unit responsive to an address of an allocation request triggered by a cache miss, said address to set mapping unit determining which set can cache data corresponding to said allocation request;
    said cache controller operable to
        pre-allocate a way in said determined set to said allocation request according to said least recently used indication of said ways,
        update said least recently used indication of all ways of said determined set upon said pre-allocation.

2. The data processing system of claim 1, wherein:
    said cache controller is further operable to permit read allocate requests to the same set processed without introducing processing stalls due to way contention.

3. The data processing system of claim 1, wherein:
    said cache controller is further operable to allow multiple outstanding allocate requests to the same set and way combination.

4. The data processing system of claim 1, wherein:
    said cache controller further includes
        an outstanding allocation request buffer storing addresses of pending allocation requests,
        a priority detection/address comparator operable to compare an address of a newly received allocation request to stall said allocation request if an address of said newly received allocation requests matches said address of any allocation request in said outstanding allocation request buffer.

* * * * *